United States Patent [19]

Beerman, Jr. et al.

[11] Patent Number: 6,084,952
[45] Date of Patent: Jul. 4, 2000

[54] SYSTEM AND METHOD FOR COMMUNICATING ELECTRONIC MESSAGES OVER A TELEPHONE NETWORK USING ACOUSTICAL COUPLING

[75] Inventors: Richard C. Beerman, Jr., Santa Clara; Brian D. Korek, San Jose; Zongbo Chen, Sunnyvale; Zhifang Du, San Jose; Wade Langill, Palo Alto; Scott Fullam, Mountain View, all of Calif.

[73] Assignee: PocketScience, Inc., Santa Clara, Calif.

[21] Appl. No.: 09/218,911

[22] Filed: Dec. 22, 1998

Related U.S. Application Data

[63] Continuation-in-part of application No. 09/003,203, Jan. 7, 1998, which is a continuation-in-part of application No. 08/588,165, Jan. 18, 1996.

[60] Provisional application No. 60/100,458, Sep. 15, 1998, and provisional application No. 60/102,834, Oct. 2, 1998.

[51] Int. Cl.[7] .................................................. H04M 11/00
[52] U.S. Cl. ..................................... 379/93.25; 379/93.24
[58] Field of Search ........................... 379/90.01, 93.01, 379/93.17, 93.21–93.25, 100.01, 100.8, 93.37; 358/402; 706/47; 709/206, 300

[56] References Cited

U.S. PATENT DOCUMENTS

| | | | |
|---|---|---|---|
| Re. 32,365 | 3/1987 | Sebestyen | 340/311.1 |
| 3,553,374 | 1/1971 | Wolf et al. | 179/1 |
| 3,879,577 | 4/1975 | Progler | 178/23 A |
| 3,944,788 | 3/1976 | Comisar et al. | 235/54 F |
| 4,442,318 | 4/1984 | Desrochers | 376/93.37 |
| 4,442,319 | 4/1984 | Treidl | 179/2 A |
| 4,620,064 | 10/1986 | Kessler et al. | 379/93.37 |
| 4,862,461 | 8/1989 | Blaner | 371/33 |
| 4,903,261 | 2/1990 | Baran et al. | 370/94.2 |
| 5,175,817 | 12/1992 | Adams et al. | 395/200 |
| 5,196,943 | 3/1993 | Hersee et al. | 358/403 |
| 5,283,856 | 2/1994 | Gross et al. | 706/47 |
| 5,485,494 | 1/1996 | Strodtbeck et al. | 370/95.2 |
| 5,546,395 | 8/1996 | Sharma et al. | 370/84 |
| 5,619,648 | 4/1997 | Canale et al. | 709/206 |
| 5,629,940 | 5/1997 | Gaskill | 370/311 |
| 5,673,031 | 9/1997 | Meier | 340/825.08 |
| 5,751,702 | 5/1998 | Evans et al. | 370/314 |
| 5,757,891 | 5/1998 | Wang | 379/93.24 |
| 5,790,804 | 8/1998 | Osborne | 395/200.75 |

FOREIGN PATENT DOCUMENTS

| | | | |
|---|---|---|---|
| WO 93/20647 | 10/1993 | WIPO | 379/93.24 |
| WO 95/25395 | 9/1995 | WIPO | 379/93.24 |

*Primary Examiner*—Wing F. Chan
*Attorney, Agent, or Firm*—Townsend and Townsend and Crew LLP

[57] ABSTRACT

A system and method for communicating electronic messages between a remote device and a messaging server over telephone lines using acoustic coupling. Information is communicated between the remote device and the messaging server using acoustical tones corresponding to the information. The messaging server provides store-and-forward capability for messages received from external sources and which are then forwarded to the remote device. The remote device generates acoustical tones corresponding to information to be transmitted to the messaging server. The acoustical tones are transmitted to the messaging server over a telephone network which is acoustically coupled to the remote device. The messaging server performs processing based on information received from the remote device. The messaging server generates acoustical tones corresponding to information, including messages, to be transmitted to the remote device. These acoustical tones are transmitted by the messaging server over the telephone network and received by the remote device via the acoustic coupling between the remote device and the telephone network.

32 Claims, 6 Drawing Sheets

SYSTEM AND METHOD FOR COMMUNICATING ELECTRONIC MESSAGES OVER A TELEPHONE NETWORK USING ACOUSTICAL COUPLING

CROSS-REFERENCES TO RELATED APPLICATIONS

This application claims priority from, and is a continuation-in-part of U.S. patent application Ser. No. 09/003,203, entitled "ELECTRONIC COMMUNICATIONS SYSTEM AND METHOD," filed Jan. 7, 1998, which in turn is a continuation-in-part of U.S. patent application Ser. No. 08/588,165, entitled "ELECTRONIC MESSAGING SYSTEM AND METHOD," filed Jan. 18, 1996. The disclosures of both these applications are herein incorporated by reference for all purposes.

This application also claims priority from the following provisional applications, the disclosures of which are herein incorporated by reference for all purposes:

1. U.S. Provisional Patent Application No. 60/100,458 entitled "ELECTRONIC MESSAGING SYSTEM," filed Sep. 15, 1998; and
2. U.S. Provisional Patent Application No. 60/102,834, entitled "ELECTRONIC MESSAGING SYSTEM," filed Oct. 2, 1998.

The following applications, including this one, are being filed concurrently, and the disclosure of each other application is herein incorporated by reference for all purposes:

U.S. patent application Ser. No.09/219,109, (Attorney Docket No. 19185-000100US) entitled "MESSAGING COMMUNICATION PROTOCOL";

U.S. patent application Ser. No. 09/219,228, (Attorney Docket No. 19185-000200US) entitled "SYSTEM AND METHOD FOR REMOTELY CONTROLLING MESSAGING SERVER FUNCTIONALITY";

U.S. patent application Ser. No. 09/218,973, (Attorney Docket No. 19185-000300US) entitled "SYSTEM AND METHOD FOR COMPRESSION AND DECOMPRESSION OF ELECTRONIC MAIL MESSAGES";

U.S. patent application Ser. No. 09/218,911, (Attorney Docket No. 19185-000400US) entitled "SYSTEM AND METHOD FOR COMMUNICATING ELECTRONIC MESSAGES OVER A TELEPHONE NETWORK USING ACOUSTICAL COUPLING";

U.S. patent application Ser. No. 09/218,932, (Attorney Docket No. 19185-000500US) entitled "SYSTEM AND METHOD FOR PROCESSING ELECTRONIC MAIL MESSAGES"; and U.S. patent application Ser. No. 09/219,082, (Attorney Docket No. 19185-000600US) entitled "SYSTEM AND METHOD FOR ENHANCING MODEM PERFORMANCE USING DIGITAL SIGNAL PROCESSING TECHNIQUES."

BACKGROUND OF THE INVENTION

The present invention relates generally to communicating information over a telephone network and more particularly to a system and method for communicating electronic messages over a telephone network between a messaging server and at least one remote device acoustically coupled to a telephone connected to the telephone network.

Prior to the proliferation of computers, people communicated with each other primarily through the use of letters, telephones and/or facsimiles. However, in recent years, with the widespread use of computers, an expanding telephone network, and the rising popularity of the Internet, an increasing number of people are resorting to electronic messaging as a mode of communication for both business and personal use. Examples of electronic messaging include the use of electronic mail (E-mail), electronic facsimiles, and various wireless services such as pagers and cellular phones.

Among the electronic messaging services stated above, the use of E-mail has seen the sharpest growth over the past few years. This is because E-mail provides a easy, expedient and efficient mechanism for exchanging information irrespective of the sender or receiver's geographical location. The use of E-mail has been further bolstered by Internet service providers (ISPs), such as America Online and AT&T WorldNet and Internet E-mail services such as Yahoo and Hotmail, who provide free E-mail accounts to Internet users. Thus, users who have an Internet account, a modem, and a computer to communicate information with each other, can at a minimal expense exchange information regardless of each party's geographic location or method of accessing the Internet.

The advent of portable computers such as laptops and personal data assistants (PDAs) has further increased the popularity of electronic messaging as a mode of communication. People can now carry computers with them wherever they go and can remotely access their E-mail accounts from any location from where a connection can be established to the Internet or to a telephone network via a modem. Advances in wireless technologies have further enhanced accessibility to electronic information. In many instances portable computers are also equipped with transceivers which allow users subscribing to wireless service providers to remotely access E-mail via a wireless communication link.

As discussed above, in order to remotely access electronic messages via conventional devices, a connection generally has to be established with a communication network. This is usually accomplished by connecting to the Internet or to some other communication network using a modem or alternatively by using wireless services. These conventional methods of connecting to a communication network have limited capabilities which may restrict a user's access to electronic information. For instance, a modem generally has to be connected to a phone line via a phone jack, typically a RJ-11 phone jack. However phone jack connections may not be readily available at all geographical locations. For example, a person traveling in an airplane generally does not have access to a phone jack, even though access to a public phone or a cellular phone is available.

Wireless services, such as cellular phone services, to a certain extent, have been successful in overcoming some of the problems associated with the need to locate phone jack connections. However, wireless services are often very expensive as they communicate over expensive wireless communication systems rather than inexpensive switched land-based telephone networks. Further, wireless services are often limited by their coverage areas. For example, paging networks and cellular networks are limited by the range of their transmitters. Additionally, wireless communication devices generally have high power consumption which leads to very short battery life and consequently high maintenance costs for the communication device.

Thus, there is a need for an electronic messaging system which will allow users to remotely access electronic messages, such as E-mail and electronic facsimile messages, without having to rely on the availability of phone jack connections or having to incur the costs associated with wireless service providers. Further, it would be desirable if the messaging system is inexpensive, portable, easy to use, has low maintenance and communication costs, and provides reliable communication of information. It is also desirable that the coverage area of the messaging system be at least comparable to that of existing telephone networks.

SUMMARY OF THE INVENTION

The present invention provides a system and method for communicating electronic messages between a remote device and a messaging server over telephone lines using acoustic coupling. Information is communicated between the remote device and the messaging server using acoustical tones. In a specific embodiment, the remote device generates acoustical tones corresponding to information to be transmitted to the messaging server. The information in the form of acoustical tones is transmitted to the messaging server over a telephone network via an acoustical coupling between the remote device and a telephone coupled to the telephone network. The messaging server performs processing based on information received from the remote device, and generates acoustical tones corresponding to information, including electronic messages, to be transmitted to the remote device. These acoustical tones are transmitted to the remote device over a telephone network and received by the remote device via the acoustical coupling between the remote device and the telephone network. Messages retrieved from the acoustical tones can then be accessed by the user of the remote device.

According to one aspect of the present invention, a remote device user initiates a connection to the messaging server by dialing into the messaging server using a phone. The remote device may then be acoustically coupled to the phone and initialization information may be transmitted to the messaging server via the acoustical coupling. The messaging server uses the initialization information to authenticate the remote device. A session is established between the remote device and the messaging server if the authentication is successful, otherwise the connection between the remote device and the messaging server is terminated. In one embodiment, a message may be sent to the remote device indicating unsuccessful authentication.

According to another aspect of the present invention, information transmitted from the remote device to the messaging server includes commands or instructions to be processed by the messaging server. The messaging server receives the commands, performs substantially all the processing required to satisfy the commands, prepares responses to the commands, and transmits the responses back to the remote device.

According to yet another aspect of the present invention, information transmitted from the remote device to the messaging server includes messages to be distributed to recipients specified by the addressee fields of the messages. These messages may include facsimile messages which are faxed to the recipients and E-mail messages which are routed to the recipients via a communication link such as the Internet. Information transmitted to the messaging server may also include user preference information.

According to yet another aspect of the present invention, information transmitted from the messaging server to the remote device includes messages received by the messaging server and addressed to the user of the remote device. The messages transmitted to the remote device can then be viewed or accessed by the user of the remote device.

According to another aspect of the present invention, the messaging server provides store-and-forward capability for messages received from external sources, such as the Internet, and addressed to users of the messaging system. Based on the addressee information of the received message, the messaging server determines the remote device to which the message is to be transmitted. The message may then be transmitted to the particular remote device when the remote device establishes a communication session with the messaging server.

Specific embodiment of the present invention present several advantages over conventional messaging systems. For example, the messaging system according to the present invention obviates the need for phone jack connections or subscriptions to wireless services to send or receive electronic messages. Users may access electronic messages by placing a phone call to the messaging server using an ordinary phone over conventional telephone networks. The present invention may also minimize the amount of time needed to transfer information between remote devices and the messaging server, thus providing an inexpensive and easy mechanism for users to access electronic information. Specific embodiments of the remote device have low power consumption resulting in longer battery life and reduced maintenance costs. Several other advantages of the present invention may be realized by reference to the remaining portions of the specification and drawings.

BRIEF DESCRIPTION OF THE DRAWINGS

Additional objects and features of the invention will be more readily apparent from the following detailed description and appended claims when taken in conjunction with the drawings, in which:

DESCRIPTION OF THE SPECIFIC EMBODIMENTS

The present invention discloses a system and method for communicating electronic messages over a telephone network between a messaging server and at least one remote device which is acoustically coupled to a telephone connected with the telephone network. The electronic messages may include E-mail messages, facsimile messages or pager messages.

Figure 1:
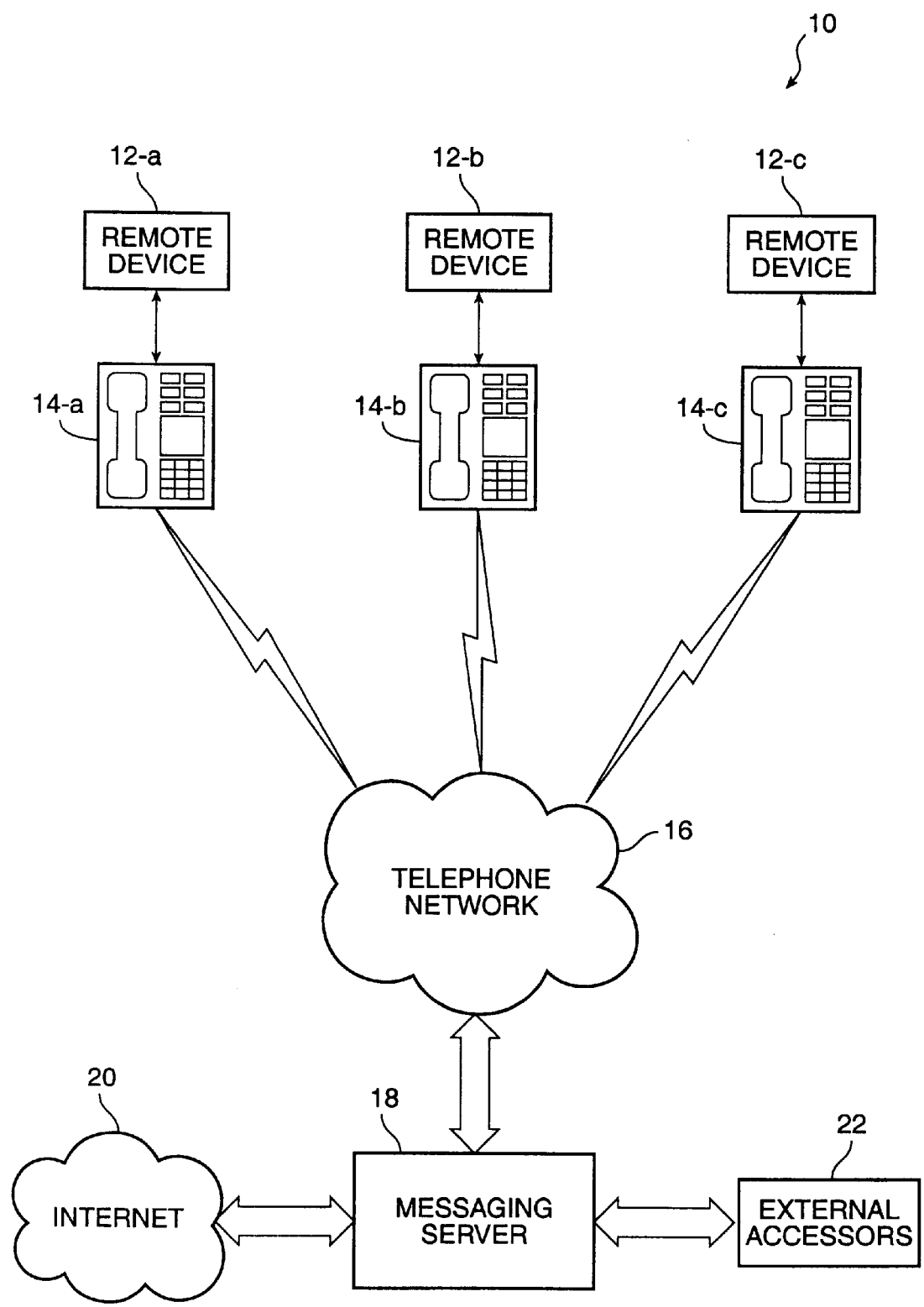
FIG. 1 depicts a high-level block diagram showing components of a messaging system embodying the present invention.

FIG. 1 depicts a high-level block diagram showing components of messaging system 10 embodying the present invention. As shown, messaging system 10 comprises a number of remote devices 12a–12c acoustically coupled to telephones 14a–14c which are connected to telephone network 16, which in turn is coupled to messaging server 18. Telephone network 16 typically includes telephone lines, but may also include a variety of other communication links such as cellular links, private branch exchange (PBX) links, or Integrated Services Digital Network (ISDN) links. Messaging server 18 may also be coupled to Internet 20 and to other external accessors 22 such as Post Office Protocol (POP3) clients, or Internet service providers.

Messaging system 10 enables remote devices 12a–12c to access E-mail messages addressed to users of the remote devices and which have been received and stored by messaging server 18. Remote devices 12a–12c may also send electronic messages to messaging server 18 for distribution to recipients indicated by the addressee field of the messages.

In a specific embodiment, messaging system 10 may be based on a client-server architecture with messaging server 18 acting as a server and remote devices 12a–12c acting as clients. Messaging server 18 receives processing requests from remote devices 12a–12c, performs substantially all the processing necessary to satisfy the requests, formulates responses to the requests, and provides these responses to remote devices 12a–12c. It should be apparent to those or ordinary skill in the art that the scope of the present invention is not limited to a client-server architecture, and that other configurations are also encompassed with the scope of the present invention.

Messaging server 18 and remote device 12 communicate messaging information with each other when a user of remote device 12 initiates a connection to messaging server 18 and a session is established between remote device 12 and messaging server 18. A connection to messaging server 18 is generally initiated when a user of remote device 12 initiates a telephone call by manually dialing in to messaging server 18. Before a session may be established, messaging server 18 may perform authentication of remote device 12 to determine if remote device 12 is authorized to establish a session with messaging server 18. A session is established if remote device 12 authentication is successful, else the connection between remote device 12 and messaging server 18 is terminated. In one embodiment, a message may be sent to remote device 12 indicating unsuccessful authentication.

Information is communicated between remote device 12 and messaging server 18 using acoustical tones. Remote device 12 generates acoustical tones which encapsulate information to be transmitted from remote device 12 to messaging server 18. To facilitate transmission of the acoustical tones over telephone network 16, remote device 12 is acoustically coupled with the handset receiver of telephone 14. The acoustical tones may be transmitted to messaging server 18 over telephone network 16 via the acoustical coupling between remote device 12 and telephone 14. Messaging server 18 interprets the acoustical tones received from remote device 12 and may perform processing requested by remote device 12. Messaging server 18 communicates with remote device 12 by generating acoustical tones corresponding to messaging information to be transmitted to remote device 12. The acoustical tones are transmitted to remote device 12 via telephone network 16 and received by the remote device via the acoustical coupling between remote device 12 and the telephone 14. After information exchanges have been completed, the connection session between remote device 12 and messaging server 18 is terminated.

Messaging server 18 and remote device 12 may employ several network protocol techniques, error correction/detection techniques, and digital signal processing (DSP) techniques to ensure reliability of messaging information communicated between remote device 12 and messaging server 18. For details about these techniques, please refer to co-pending U.S. patent application Ser. No. 09/219,109, (Attorney Docket No. 19185-000100US) entitled "MESSAGING COMMUNICATION PROTOCOL," U.S. patent application Ser. No. 09/218,973, (Attorney Docket No. 19185-000300US) entitled "SYSTEM AND METHOD FOR COMPRESSION AND DECOMPRESSION OF ELECTRONIC MAIL MESSAGES," and U.S. patent application Ser. No. 09/219,082, (Attorney Docket No. 19185-000600US) entitled "SYSTEM AND METHOD FOR ENHANCING MODEM PERFORMANCE USING DIGITAL SIGNAL PROCESSING TECHNIQUES" filed concurrently with the present application and owned by a common assignee.

Figure 2:
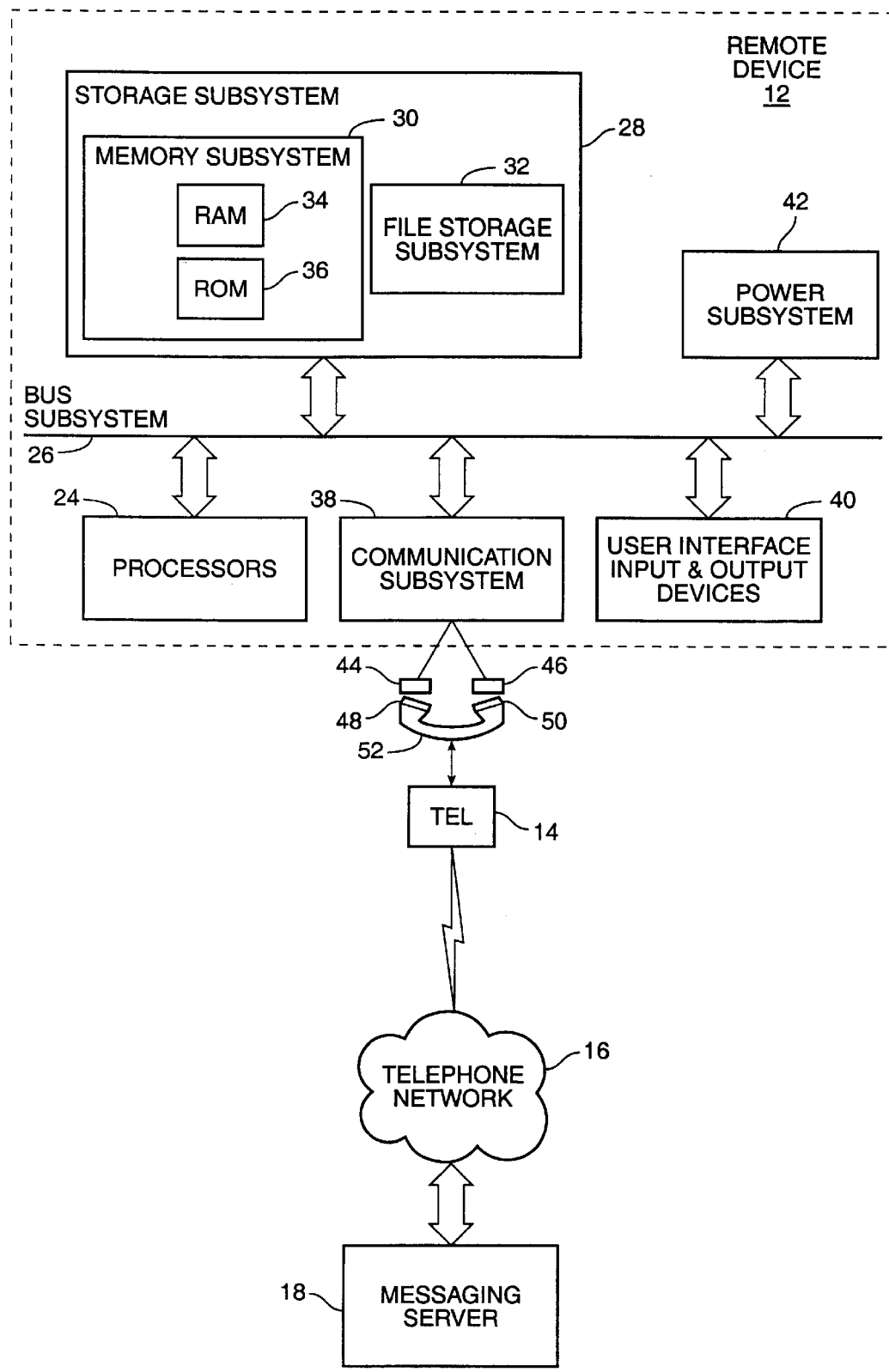
FIG. 2 depicts a block diagram of a remote device according to an embodiment of the present invention.

FIG. 2 depicts one embodiment of remote device 12. As shown, remote device 12 includes at least one processor 24 which communicates with a number of subsystems via bus subsystem 26. These subsystems typically include a storage subsystem 28 comprising memory subsystem 30 and file storage subsystem 32, user interface input and output devices 40, a communication subsystem 38 including speaker 46 and microphone 44, and a power subsystem 42. Remote device 12 may be a data processing device which generally can operate independent of the messaging server 22. Examples of remote devices include desktop computers, PDAs, laptops, and several other hand-held or portable devices.

Bus subsystem 26 provides a mechanism for allowing the various components and subsystems of remote device 12 communicate with each other as intended. Bus subsystem 26 is shown schematically as a single bus, but a typical system may have a number of buses such as a local bus and one or more expansion buses, as well as serial and parallel ports.

User interface input devices typically include a keyboard, a scanner, a mouse, a trackball, a touchpad, a graphics tablet, a touchscreen incorporated into the display, a joystick, or any other devices for inputting information. Other types of user interface input devices, such as voice recognition systems, are also possible. In a portable hand-held remote device embodiment, user interface devices typically include a keyboard, a mouse or a touchscreen.

User interface output devices typically include a display subsystem, which includes a display controller and a display device coupled to the controller. The display device may be a cathode ray tube (CRT), a flat-panel device such as a liquid crystal display (LCD), or a projection device. The display subsystem may also provide non-visual display such as audio output. In a portable hand-held remote device embodiment, the user interface output device is typically a LCD display with an electroluminescent (EL) backlight which allows the LCD to be viewed easily during low light conditions.

Memory subsystem 30 stores the various data constructs and programming modules that provide the functionality of remote device 12. Memory subsystem 30 may typically include a number of memories including a main random access memory (RAM) 34 for storage of instructions and data during program execution, and a read only memory (ROM) 36 in which fixed instructions are stored. In a specific embodiment, ROM 36 stores device identification information which uniquely identifies the particular remote device.

File storage subsystem 32 provides persistent (non-volatile) storage for program and data files, and may include one or more hard disk drives and one or more floppy disk drives (with associated removable media).

Communication subsystem 38 facilitates the acoustical coupling between remote device 12 and phone 14. Communication subsystem 38 is also responsible for facilitating communication of information between remote device 12 and messaging server 18. Communication subsystem 38 generates acoustical tones which encapsulate information to be transmitted to messaging server 18. Additionally, communication subsystem 38 retrieves information from acoustical tones generated by messaging server 18 and transmitted to remote device 12. Communication subsystem 38 includes speaker 46 and microphone 44 which facilitate acoustical coupling between remote device 12 and telephone handset 52 of phone 14. In a specific embodiment, speaker 46 is acoustically coupled to mouthpiece 50 of telephone handset 52 and transmits acoustical tones generated by remote device 12 to messaging server 18 via telephone network 16. Likewise, microphone 44 is acoustically coupled to earpiece 48 of handset 52 and receives acoustical tones transmitted by messaging server 18. Speaker 46 and microphone 44 are adjustable to facilitate coupling with handsets of different shapes and sizes.

Power subsystem 42 provides power to the various subsystems of remote device 12. In a portable hand-held embodiment of remote device 12, power subsystem 42 may typically include one or more alkaline batteries. A low battery indicator may also be provided.

Figure 3:
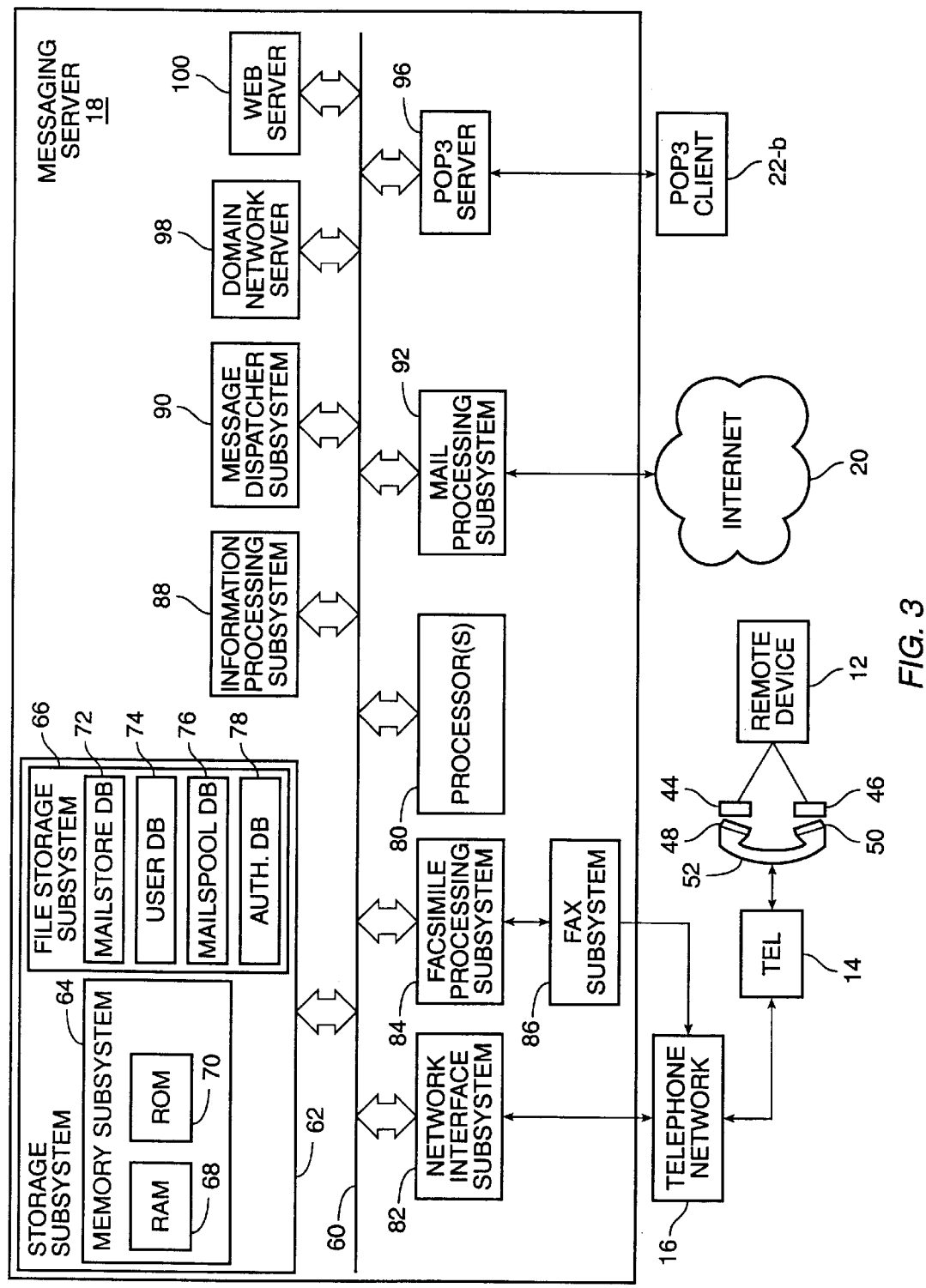
FIG. 3 depicts a block diagram of a messaging server according to an embodiment of the present invention.

FIG. 3 depicts a block diagram of messaging server 18 which may be coupled with remote device 12 via telephone network 16. Messaging server 18 comprises a processor 80, storage subsystem 62 including a memory subsystem 64 and file storage subsystem 66, and one or more servers and subsystems coupled to each other via a backbone network or bus subsystem 60, such as an Ethernet network. Backbone network 60 provides a mechanism for allowing the various components and subsystems of messaging server 18 communicate with each other as intended. The subsystems and servers may include a network interface subsystem 82, an information processing subsystem 88, a mail processing subsystem 92, a message dispatcher subsystem 90, and a facsimile processing subsystem 84 optionally coupled to facsimile machine 86. Messaging server 18 may also optionally include a POP3 server 96, a domain network server (DNS) 98 and a WEB server 100. Each of these servers and subsystems will now be described in more detail.

Storage subsystem 62 stores the various data constructs and programming modules that provide the functionality of messaging server 18. Memory subsystem 64 typically includes a number of memories including a main random access memory (RAM) 70 for storage of instructions and data during program execution and a read only memory (ROM) 68 in which fixed instructions are stored.

File storage subsystem 66 provides persistent (nonvolatile) storage for program and data files, and typically includes at least one hard disk drive and at least one floppy disk drive (with associated removable media). File storage subsystem 66 may also include other types of tangible media such as CD-ROM drives, optical storage media, removable media cartridges, and the like. One or more of the drives may be located at a remote location, such as in a server on a local area network or at a site accessible via the Internet. File storage subsystem 66 provides a repository for storing various databases and files used by messaging server 18 such as mailspool database 76 for each remote device, a mailstore database 72 for each remote device, a remote device user database 74, and an authentication database 78.

In one embodiment, a mailspool database is maintained for each remote device of messaging system 10. The mailspool database stores messages received by messaging server via Internet 20 addressed to a user of the remote device. Typically, each message is indexed by a unique message identifier. The mailspool database provides a mechanism which allows external users, for example POP3 clients, to access messages stored by messaging server 18.

In one embodiment, a mailstore database is maintained for each remote device and typically contains messages addressed to remote device 12. The mailstore database may also store information related to message indices, and status flags associated with the messages, including status flags indicating whether a message has been transmitted to remote device 12. The messages stored in the mailstore database are generally synchronized with the messages stored in the mailspool database. In one embodiment, the messages are stripped off their MIME, HTML and redundant text contents before being stored in the mailstore database. Typically, the messages are indexed by the unique message identifier associated with each message.

In one embodiment, user database 74 stores preferences and other configuration parameters for each remote device 12. Authentication database 78 stores information needed for authentication of remote device 12 during session setup time. The information stored in the authentication database may include a list of remote device identifiers identifying remote devices which are authorized to communicate with messaging server 18. A listing of E-mail addresses of the users of the remote devices may also be stored in the authentication database. This listing may be used by the messaging server to verify if addressees of inbound messages received by the messaging server via the Internet are actually remote device users. In one embodiment, authentication database 78 may store a list of E-mail addresses for remote device users and their associated remote device identifiers. The E-mail address to remote device identifier mapping may be used to determine the recipient remote device.

Network interface subsystem 82 is responsible for receiving messaging information transmitted by remote device 12 and for transmitting messaging information from messaging server 18 to remote device 12 via telephone network 16. In a specific embodiment, network interface subsystem 82 may include a modem and one or more digital signal processing (DSP) modules. Network interface subsystem 82 receives acoustical tones transmitted by remote device 12 and converts the tones to digital information which is then made available to the other subsystems of messaging server 18 for further processing. Network interface subsystem 82 may also convert digital information to be transmitted to remote device 12 to analog acoustical signals. In alternate embodiments, network interface subsystem 82 may also be configured to receive analog signals or digitized analog samples in discrete time domain encapsulating information transmitted by remote device 12. Network interface subsystem 82 may also be configured to monitor of the amount of information, including messages, received from or transmitted to remote device 12.

In a specific embodiment, the DSP modules in combination with the modem employ several network protocol techniques, error correction/detection techniques, and digital signal processing (DSP) techniques to ensure reliability of messaging information communicated between remote device 12 and messaging server 18. For details about these techniques, please refer to co-pending U.S. patent application Ser. No. 09/219,109, (Attorney Docket No. 19185-

000100US) entitled "MESSAGING COMMUNICATION PROTOCOL," U.S. patent application Ser. No. 09/218,973, (Attorney Docket No. 19185-000300US) entitled "SYSTEM AND METHOD FOR COMPRESSION AND DECOMPRESSION OF ELECTRONIC MAIL MESSAGES," and U.S. patent application Ser. No. 09/219,082, (Attorney Docket No. 19185-000600US) entitled "SYSTEM AND METHOD FOR ENHANCING MODEM PERFORMANCE USING DIGITAL SIGNAL PROCESSING TECHNIQUES" filed concurrently with the present application and owned by a common assignee.

Information processing subsystem 88 is responsible for performing substantially all the processing performed by messaging server 18. In a specific embodiment, information processing subsystem 88 acts as a manager for information and data transmitted to and from messaging server 18. In a specific embodiment, tasks performed by information processing subsystem 88 include but are not limited to: receiving processing requests from the remote devices, performing substantially all the processing necessary to satisfy the remote device requests, formulating responses to the requests, determining messages to be transmitted to remote device 12, and transmitting the messages and responses to remote device 12.

Information processing subsystem 88 may also be configured to authenticate remote device 12 when the remote device attempts to establish a session with messaging server 18. In a specific embodiment, authentication is based on remote device identification information transmitted by remote device 12 and which uniquely identifies remote device 12. Information processing subsystem 88 accesses authentication database 78 to determine whether the requesting remote device, as identified by the remote device identification information, is authorized to establish a session with messaging server 18. The remote device connection is terminated if the remote device is not authorized to establish a session with messaging server 18. In one embodiment, an E-mail message is sent to the unauthorized remote device user indicating authentication failure.

Information processing subsystem 88 may also be configured to determine compression techniques to be used for compression of information before it is transmitted to remote device 12. Selection of a particular compression technique is generally based on remote device information received from the remote device. The compression technique is selected so as to maximize the efficiency of data transfer between remote device 12 and messaging server 18. In a specific embodiment, information processing subsystem 88 may also process messages received via Internet 20 or from external users 22 and prepare these messages for transmission to remote device 12 upon the next session with remote device 12. Information processing subsystem 88 may also update the various databases stored in storage subsystem 62.

Message dispatcher subsystem 90 may be configured to process outbound messages including electronic mail messages to be transmitted via Internet 20 and facsimile messages to be transmitted via facsimile processing subsystem 84. Message dispatcher subsystem 90 determines whether a particular message is an electronic mail message or a facsimile message and accordingly forwards the message to mail processing subsystem 92, or to facsimile processing subsystem 84, respectively, for further processing.

Mail processing subsystem 92 is generally responsible for processing messages received from external sources via Internet 20 and for distributing E-mail messages from messaging server 18 to their recipients via Internet 20. Tasks performed by mail processing subsystem 92 include but are not limited to: determining the remote device to which a message is to be transmitted based on the addressee field of the message, writing messages received by messaging server 18 to mailspool database 76, stripping messages off their MIME, HTML, and redundant text content, writing the stripped messages to mailstore database 72, receiving from message dispatcher 90 E-mail messages to be distributed via Internet 20 and distributing the messages.

Facsimile processing subsystem 84 is responsible for processing facsimile messages to be distributed to external recipients. Facsimile processing subsystem 84 formats facsimile messages into a format which is compatible with commercial facsimile machines software. Facsimile processing subsystem 84 may then either store the formatted facsimile messages in storage subsystem 62 from where the messages may be accessed by facsimile subsystem 86, or alternatively, may forward them directly to facsimile subsystem 86. Facsimile subsystem 86 includes facsimile software and facsimile modem and facilitates faxing of facsimile messages to their recipients via telephone network 16.

POP3 server 96 is a standard server implementing the Post Office Protocol (POP) and allows POP3 clients 22-b to access electronic mail messages stored by messaging server 18 in storage subsystem 62.

Messaging server 18 may also optionally include a Domain Network Server (DNS) 98 and a WEB Server 100 which allow users of messaging system 10 to access messaging server 18 via a web page. Web access allows subscribers to perform a variety of tasks such as setting/modifying user preferences, setting/modifying connection configuration parameters, and even checking account related information. This information is usually stored in storage subsystem 62 in user database 74 or authentication database 78. DNS server 98 allows messaging server 18 to communicate with other network nodes by mapping machine names to Internet addresses and vice versa.

Figure 4A:
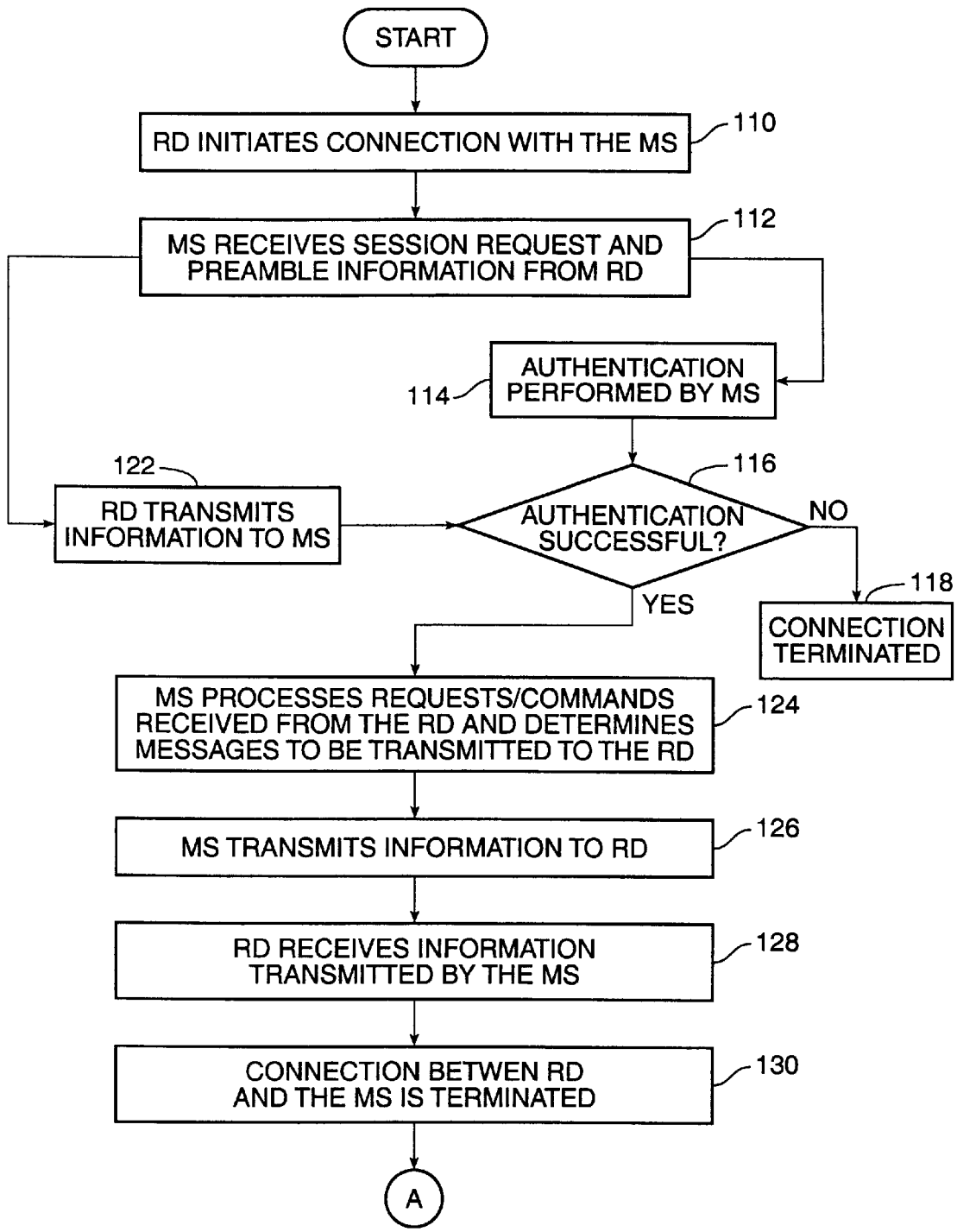
FIGS. 4a and 4b depict flowcharts showing steps performed by the remote device and the messaging server for exchanging information according to an embodiment of the present invention.
Figure 4B:
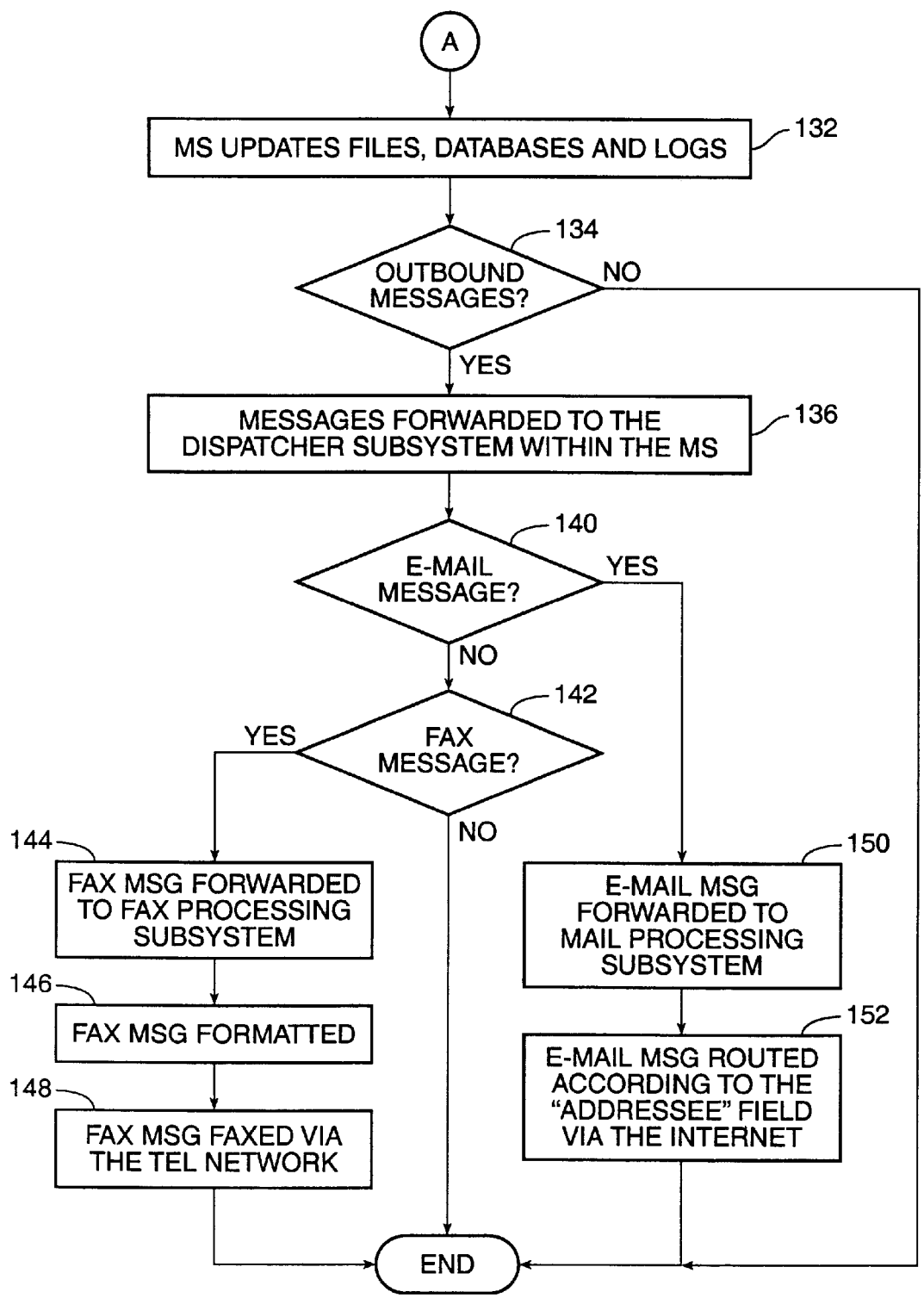

FIGS. 4a and 4b are flowcharts depicting the sequence of functions or operations executed by remote device 12 and messaging server 18 for communicating information between each other. At step 110, remote device (RD) 12 initiates a connection with messaging server (MS) 18. This usually occurs when a user of remote device 12 initiates a telephone call by manually dialing in to messaging server 18 using an appropriate telephone number and requests a session to be established between remote device 12 and messaging server 18. Optionally, messaging server 18 may answer the remote device's call request with an audio greeting.

Data exchange between remote device 12 and messaging server 18 is half-duplex, implying that either remote device 12 or messaging server 18 is transmitting on the connection at a given time. As described earlier, information transmitted from remote device 12 to messaging server 18 is encapsulated in acoustical tones generated by communication subsystem 38 of remote device 12. The acoustical tones are transmitted via the acoustic coupling between speaker 46 of remote device 12 and telephone handset 52 to telephone network 16. The acoustical analog signals are then transmitted via telephone network 16 to messaging server 18.

In a specific embodiment, information transmitted by remote device 12 to messaging server 18 during the first phase of the call includes a preamble frame containing information identifying remote device 12. Typically, information contained in the preamble frame includes remote device identification information, remote device configuration information, and various other session related parameters. In general, information contained in the preamble frame enables messaging server 18 to determine: whether a session is permitted to continue between messaging server 18 and the requesting remote device, access or permission rights for the remote device, encoding/decoding schemes to be used for communicating with the remote device, and compression/decompression schemes to be used for communicating with the remote device. Details of the preamble frame are described in co-pending a U.S. patent application Ser. No. 09/219,109, (Attorney Docket No. 19185-000100US) entitled "MESSAGING COMMUNICATION PROTOCOL" filed concurrently with the present application and owned by a common assignee.

At step 112, messaging server 18 receives and interprets the acoustical tones transmitted by remote device 12 that is requesting a session with messaging server 18. In a specific embodiment, network interface subsystem 82 of messaging server 18 receives the acoustical tones via telephone network 16. The modem and DSP modules within network interface subsystem 82 convert the analog acoustical tones to digital information which is then provided to the various subsystems and processors of messaging server 18 for further processing.

In one embodiment of the present invention, an acknowledgment is sent by messaging server 18 to remote device 12 indicating that messaging server 18 has received the preamble information. Upon receiving this acknowledgment, at step 122, remote device 12 transmits information to messaging server 18. In a specific embodiment, remote device 12 queues up information to be transmitted to messaging server 18 and the queued up information is then transmitted to messaging server 18 in the form of acoustical tones generated by communication subsystem 38. This information is processed by messaging server 18 after successful authentication of remote device 12. After the information has been transmitted, remote device 12 sends a message to messaging server 18 indicating information transfer from remote device 12 has been completed and that remote device 12 is now ready to receive information from messaging server 18. Messaging information transmitted to messaging server 18 may include messages to be sent to recipients generally indicated by the "addressee" field of the message, remote device configuration or preference information, and/or messaging instructions/commands to be processed by messaging server 18. As previously stated, various error detection/correction techniques and data modulation techniques are used by messaging server 18 to ensure reliability of data received from remote device 12.

At step 114, messaging server 18 performs authentication to determine if remote device 12 is permitted to establish a session with messaging server 18. In a specific embodiment, messaging server 18 checks authentication database 78 to determine if the remote device is authorized to establish a session with messaging server 18. Authentication database 78 generally stores information on users of messaging system 10. In a specific embodiment, authentication is based on the remote device identification information which is included in the preamble frame transmitted by remote device 12 and which uniquely identifies the remote device requesting the connection. However, in other embodiments, several other criteria such as a user specific password, or user accounting status, or user privileges, etc., may be used for authentication purposes. At step 116, messaging server 18 determines if remote device 12 has been successfully authenticated. If authentication of remote device 12 is unsuccessful, the connection between remote device 12 and messaging server 18 is terminated. In one embodiment, an E-mail message is sent to the user of the remote device indicating failure of authentication. If authentication is successful, messaging server proceeds with processing information transmitted by remote device 12, as indicated in step 124.

At step 124, messaging server 18 performs substantially all the processing necessary to satisfy the command/instructions received from remote device 12 and determines messages to be transmitted to the remote device. Messaging server 18 formulates responses to remote device requests, and queues up the responses in preparation for transmission to remote device 12. In a specific embodiment, processing is primarily performed by information processing subsystem 88. Using the remote device identification information, information processing subsystem 88 accesses mailstore database 72 to determine messages addressed to the remote device user and which have not been transmitted to the connected remote device. These messages are also queued up for transmission to remote device 12.

At step 126, the queued up information is transmitted by messaging server 18 to remote device 12 via telephone network 16. In a specific embodiment, network interface subsystem 82 is responsible for transmitting information from messaging server 18 to remote device 12. Information processing subsystem 88 forwards the queued up digital information to network interface subsystem 82, which then generates analog acoustical tones corresponding to the digital information. The acoustical tones are then transmitted via telephone network 16 to remote device 12.

At step 128, remote device 12 receives information in the form of acoustical tones transmitted by messaging server 18. The acoustical tones are received by remote device 12 via the acoustic coupling between microphone 44 of remote device 12 and telephone earpiece 48. Communication subsystem 38 retrieves information from the acoustical tones by converting the tones to digital information. After information has been received by remote device, the session between remote device 12 and messaging server 18 may be terminated, at step 130.

After the session between remote device 12 and messaging server 18 has been terminated messaging server 18 proceeds to process distribution of messages downloaded from remote device 12. This processing is generally done after the session has been terminated to reduce the amount of connection time between remote device 12 and messaging server 18. This reduction in connection time directly translates to reduced telecommunication related costs for the user of remote device 12.

At step 132, information processing subsystem 88 updates the various files and logs associated with messaging system 10 and which are generally stored on storage subsystem 62. Information processing subsystem 88 retrieves from network interface subsystem 82 information whether indicating messages which were successfully transmitted to remote device 12. Messages which were not transferred to remote device 12, possibly due to problems associated with the connection between remote device 12 and messaging server 18, are tagged accordingly in mailstore database 72. These messages will be queued up for transmission during the next connection between that particular remote device and messaging server 18. Messages which were successfully transmitted are also marked accordingly in mailstore database 72. Information processing subsystem 88 may also update user profiles and preferences which are stored in user database 74.

At step 134, information processing subsystem 88 determines if there are any outbound facsimile or E-mail messages received from remote device 12 which are to be sent to recipients as indicated by the "addressee" field of the messages. If there are no outbound messages, the messaging server processing ends, else processing continues with step 136.

At step 136, information processing subsystem 88 forwards the messages to message dispatcher subsystem 90 which determines whether a particular message is a facsimile message or an E-mail message at steps 142 and 140, respectively. Message dispatcher 90 forwards facsimile messages to facsimile processing subsystem 84, at step 144, and forwards E-mail messages to mail processing subsystem 92, at step 150.

At step 146, facsimile processing subsystem 84 formats the facsimile messages into a format which is compatible with commercial facsimile machines software. Examples of formatting performed by facsimile processing subsystem 84 include but are not limited to: performing word wrapping on the message text, and superimposing text fields such as "FROM," "TO," etc. on the message text. The formatted facsimile messages are then stored on storage subsystem 62 in a location where they may be accessed by facsimile subsystem 86. Alternatively, formatted facsimile messages may be directly forwarded to facsimile subsystem 86 for faxing. At step 148, facsimile subsystem 86 faxes the facsimile messages to their recipients via telephone network 16. At step 152, mail processing subsystem 92 routes the E-mail messages to the recipients indicated by the "addressee" information of the message. This routing is generally done via Internet 20.

Figure 5:
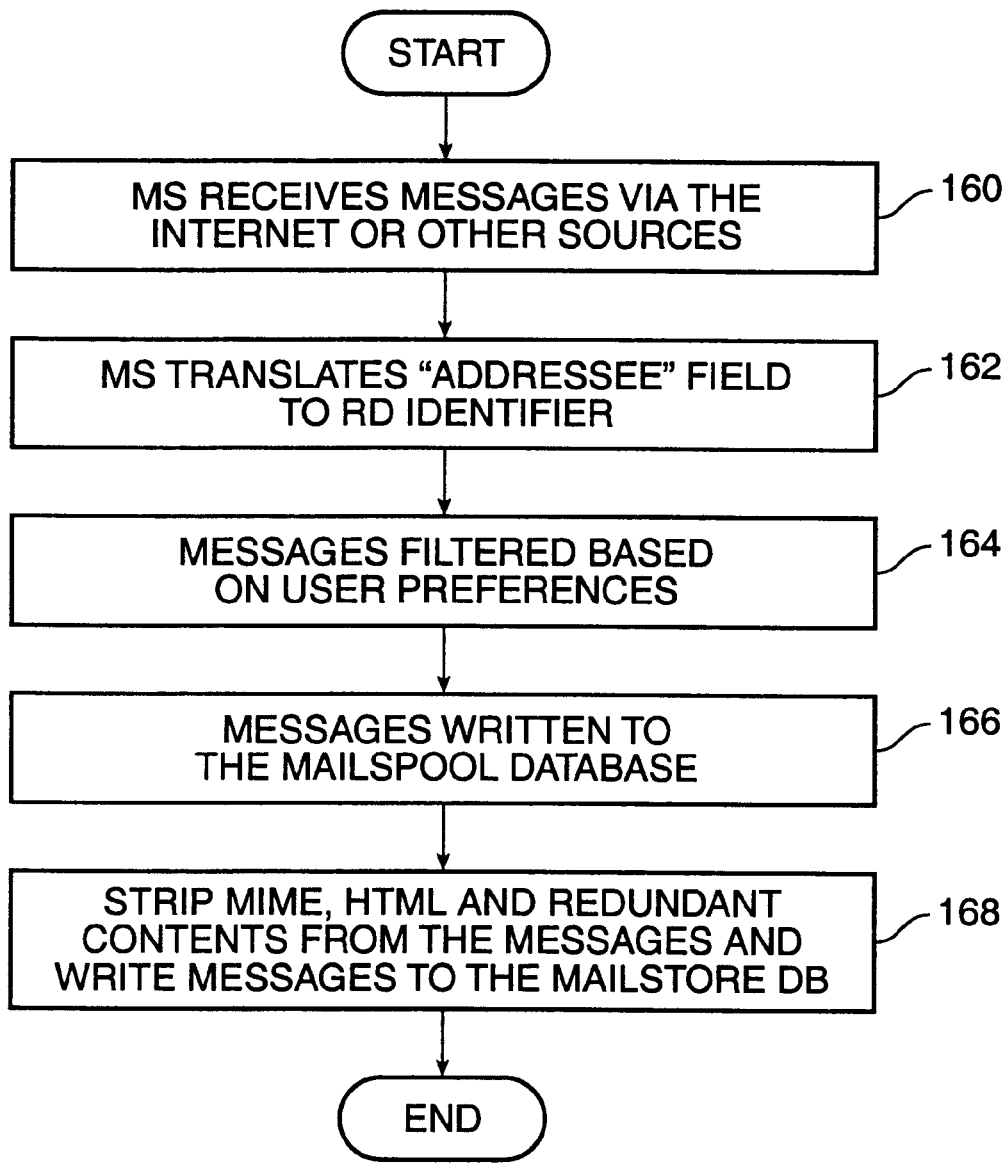
FIG. 5 depicts a flowchart illustrating functions performed by the messaging server for processing messages received via the Internet according to an embodiment of the present invention.

FIG. 5 depicts steps executed by messaging server 18 for processing messages received by messaging server 18 via Internet 20 or other external sources. At step 160, messages arrive at mail processing subsystem 92 via Internet 20 or other external sources. In one embodiment, at step 162, mail processing subsystem 92 determines the remote device to which the message is to be transmitted by translating the addressee information of each message to its corresponding remote device identification information. The addressee information to remote device identification information is facilitated by the remote device user E-mail address to remote device identifier mapping stored in authentication database 78. As previously stated, this mapping stores a list of E-mail addresses for the users of the remote devices and associated remote device identifiers corresponding to the remote device used by the users. In a specific embodiment, one or more E-mail addresses may be mapped to a common remote device identifier, indicating that the remote device is shared by more than one user. In other embodiments, the mapping information may also contain additional information to facilitate processing of incoming messages. While the mapping information is typically stored in authentication database 78, in other embodiments the mapping information may be stored on storage subsystem 62 or may alternatively be stored locally by mail processing subsystem 92. In a specific embodiment, the mapping information is periodically updated as new users subscribe to services offered by messaging system 10.

In a specific embodiment, mail processing subsystem 92 extracts addressee information from the inbound mail message and then queries authentication database 78. If the queried addressee is found in authentication database 78, the query returns the remote device identifier corresponding to the addressee, else a message indicating that the address was not found is returned to mail processing subsystem 92. If the address is not found in authentication database 78, the E-mail message containing the address is bounced back to the sender with the notification that the E-mail message was undeliverable. If the query returns with a remote identifier for the address, the process continues with step 164. In alternate embodiments where the remote device may be identified using other criteria, such as user name or user E-mail address, the translation step may not be needed.

At step 164, mail processing subsystem 92 may perform filtering of messages based on user preferences and rules stored in user database 74. Filtering may be performed on various aspects of a message such as the name of the sender, the name of the recipient, the subject title of the message, or the size of the message. It should be apparent that other criteria may also be used for filtering purposes. Several types of filtering schemes may be supported, such as accepting messages that satisfy a filter criterion, or alternatively discarding messages that meet a filter criterion. These filtering preferences may be set or modified via commands transmitted from remote device 12. Alternatively, a user may also set or modify preferences via WEB server 100.

After the messages have been filtered, at step 166, the messages are written to the mailspool database for the remote device. Each message is assigned a unique identifier which uniquely identifies the message on messaging server 18. The unique identifier is used for indexing messages in the mailspool database.

At step 168, mail processing subsystem 92 writes the messages to the mailstore database 72 for the remote device. Messages in mailstore database are usually indexed based on the unique identifier associated with each message in mailspool database 76. In a specific embodiment, before a message is written to mailstore database 72, mail processing subsystem 92 removes MIME content, HTML contents and redundant contents from the text of the message. Redundant contents typically include text items which have been sequentially repeated for more than a threshold number of times. For example, in one embodiment where the repetition threshold value is set to three, a "- - - - - -" is reduced to "- - -" before the message is written to mailstore database 72. Message stripping is performed to reduce the size of messages to be transmitted to remote device 12. A smaller message size reduces the amount of time required to transmit the message from messaging server 18 to remote device 12. This directly translates to reduced telecommunication related costs for the user of remote device 12. However, in alternate embodiments where high speed transfer communication links are used, stripping of messages may not be required. These messages are then queued for transmission to remote device 12 upon the next connection to remote device 12, as indicated by step 124 in FIG. 4*a* and described above.

Conclusion

A system and method are disclosed for communicating electronic messages between a remote device and a messaging server over telephone lines using acoustic coupling. The messaging server provides store-and-forward capability by storing electronic messages received via Internet 20 or other external sources. The stored messages are then communicated to remote device 12 when remote device 12 establishes a session with messaging server 18.

In a specific embodiment, remote device 12 initiates a connection to messaging server 18 by dialing into the messaging server using a phone. After messaging server 18 has successfully authenticated the remote device, a session is established between remote device 12 and messaging server 18 wherein information is transferred between remote device 12 and messaging server 18 in the form of acoustical tones over a telephone network acoustically coupled to remote device 12.

Although specific embodiments of the invention have been described, various modifications, alterations, alternative constructions, and equivalents are also encompassed within the scope of this application. For example, the described invention is not restricted to operation within certain specified computer environments, but is free to operate within a plurality of computer environments. Thus, while messaging server 18 has been described using specific subsystems, the functions performed by messaging server 18 may be performed by other subsystems, processors or may even be deployed on separate systems. Likewise the functions performed by remote device 12 may be performed by other subsystems or processors. Additionally, although the present invention has been described using a particular series of transactions between remote device 12 and messaging server 18, it should be apparent to those skilled in the art that the scope of the present invention is not limited to the described series of transactions.

While the present invention has been described using a particular combination of hardware and software, it should be recognized that other combinations of hardware and software are also within the scope of the present invention. For example, the functions performed by the various subsystems of remote device 12 and messaging server 18 may be performed by software modules stored in the storage subsystem and executed by processors in remote device 12 and messaging server 18, respectively. Alternatively, the present invention may be implemented only in hardware or only in software, or a combination of hardware and software, or in combinations with other hardware and software elements.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. In a communication system including a messaging server and a portable hand held remote device coupled to a telephone network, a method of communication between the remote device and the messaging server, the method comprising:

providing a message database accessible to the messaging server for storing electronic messages;

establishing an acoustical coupling between the remote device and the telephone network without requiring a wired connection between the remote device and the telephone network;

generating an initial set of acoustical tones at the remote device corresponding to setup information to be transmitted to the messaging server;

transmitting the initial set of acoustical tones to the messaging server via the acoustical coupling and over the telephone network;

receiving the initial set of acoustical tones and converting them to setup information at the messaging server;

establishing a session between the remote device and the messaging server based on the setup information;

generating a first set of acoustical tones at the remote device remote corresponding to a first set of information to be communicated from the remote device to the messaging server;

transmitting the first set of acoustical tones from the remote device to the messaging server via the acoustic coupling and over the telephone network;

converting the first set of acoustical tones to the first set of information at the messaging server;

performing processing at the messaging server based on the first set of information, the processing including performing forward error correction on the first set of information;

assembling, at the messaging server, a second set of information to be communicated to the remote device based on the first set of information and the setup information;

generating a second set of acoustical tones at the messaging server corresponding to the second set of information;

transmitting the second set of acoustical tones from the messaging server to the remote device over the telephone network; and the remote device receiving the second set of acoustical tones via the acoustical coupling and converting the second set of acoustical tones to the second set of information.

2. The method of claim 1 wherein establishing an acoustical coupling between the remote device and the telephone network comprises:

providing a phone coupled with the telephone network;

providing a speaker and a microphone coupled with the remote device;

acoustically coupling the speaker with a mouthpiece of the phone; and acoustically coupling the microphone with an earpiece of the phone.

3. The method according to claim 1 wherein:

the setup information includes remote device identification information; and establishing the session between the remote device and the messaging server includes the messaging server performing authentication of the remote device based on the remote device identification information, and establishing the session between the remote device and the messaging server if the authentication is successful.

4. The method of claim 3 wherein authentication performed by the messaging server comprises:

maintaining a database containing remote device configuration information; and determining if the remote device is authorized to establish the session with the messaging server by comparing the remote device identification information transmitted by the remote device with remote device configuration information stored in the database.

5. The method of claim 1 wherein:

the first set of information includes command requests; and assembling the second set of information comprises generating command responses to the command requests; and including the command responses as part of the second set of information.

6. The method of claim 1 wherein:

the first set of information includes remote device preference information; and wherein performing processing at the messaging server based on the first set of information comprises providing a preferences database for storing preference information for the remote device, and updating the preference database for the remote device based on the remote device preference information contained in the first set of information.

7. The method of claim 1 wherein assembling the second set of information comprises:

determining a first electronic message to be transmitted to the remote device; and including the first electronic message as part of the second set of information.

8. The method of claim 7 wherein determining the first electronic message to be transmitted to the remote device comprises:

using the remote device identification information to search the message database to identify one or more electronic messages addressed to the remote device and which have not yet been transmitted to the remote device;

selecting one of the identified electronic messages as the first electronic message.

9. The method of claim 7 further comprising:

terminating the session between the remote server and the messaging server;

determining if the first message was successfully transmitted to the remote device, and if so updating the message database to indicate the successful transmission of the first message to the remote device.

10. The method of claim 1 wherein the first set of information includes at least one message to be delivered to an addressee, the method further comprising:

determining if the message to be delivered is a facsimile message; and if the message to be delivered is a facsimile message;

formatting the message into a format compatible for faxing;

making the formatted facsimile message accessible to a facsimile module, wherein the facsimile module is configured to transmit the formatted facsimile to the addressee.

11. The method of claim 1 wherein the first set of information includes at least one message to be delivered to an addressee, the method further comprising:

determining at the messaging server if the message to be delivered is an electronic mail message; and if the message to be delivered is an electronic mail message, transmitting the electronic mail message to the addressee.

12. In a communication system including a messaging server and a portable hand held remote device coupled with a telephone network, a method of communication between the remote device and the messaging server, the method comprising:

receiving at the messaging server a message addressed to a user of the remote device;

determining the remote device to which the message is to be transmitted;

processing the message at the messaging server;

storing the message in a message database;

establishing a communication session between the remote device and the messaging server over the telephone network, wherein the remote device is acoustically coupled to the telephone network without requiring a wired connection between the remote device and the telephone network;

generating acoustical tones at the messaging server corresponding to the message to be sent to the remote device;

communicating the acoustical tones from the messaging server to the remote device over the telephone network via the acoustical coupling; and retrieving the message from the acoustical tones at the remote device.

13. The method of claim 12 wherein determining the remote device to which the message is to be transmitted comprises:

maintaining a list of remote devices and their corresponding users;

determining a user to which the message is addressed, and identifying from the list the remote device corresponding to the user.

14. The method of claim 12 wherein processing the message at the messaging server comprises:

providing a preference database storing a set of preferences for the remote device; and wherein storing the message in the message database only if the message satisfies the set of preferences.

15. The method of claim 14 wherein the set of preferences comprises filter rules selected from a group of filter rules including of rules based on the addressee field of the message, rules based on the sender field of the message, rules based on the title field of the message, rules based on the subject contents of the message, and rules based on the size of the message.

16. A messaging system for communicating messaging information comprising:

a messaging server coupled to a telephone network;

a hand held remote device acoustically coupled to the telephone network without requiring a wired connection between the remote device and the telephone network;

the remote device configured to generate an initial set of acoustical tones corresponding to setup information to be transmitted to the messaging server and to transmit the initial set of acoustical tones over the telephone network via the acoustic coupling;

the remote device further configured to generate a first set of acoustical tones corresponding to a first set of information to be transmitted to the messaging server, and to transmit the first set of acoustical tones to the messaging server;

the remote device further configured to receive a second set of acoustical tones from the messaging server, and to convert the second set of acoustical tones to a second set of information; and wherein the messaging server comprises:

a processor;

a memory accessible to the processor, the memory configured to store electronic message;

a network interface module configured to receive the initial set of acoustical tones transmitted by the remote device, and to convert the initial set of acoustical tones to the setup information;

the network interface module further configured to receive the first set of acoustical tones transmitted by the remote device, and to convert the first set of acoustical tones to the first set of information;

the network interface module further configured to generate the second set of acoustical tones corresponding to the second set of information, and to communicate the second set of acoustical tones to the remote device over the telephone network via the acoustical coupling;

an information processing module configured to establish a session between the remote device and the messaging server based on the setup information transmitted by the remote device; and the information processing module further configured to perform processing based on the first set of information and the setup information, to perform forward error correction on the first set of information and to determine the second set of information to be transmitted to the remote device.

17. The system of claim 16 wherein the remote device further comprises:

a speaker and a microphone configured to acoustically couple the remote device with a phone coupled with the telephone network;

the speaker configured to transmit the initial set and first set of acoustical tones to the telephone network via the acoustic coupling; and the microphone configured to receive the second set of acoustical tones transmitted by the messaging server via the acoustic coupling.

18. The system of claim 16 wherein:

the setup information includes remote device identification information; and the information processing module is configured to authenticate the remote device based on the remote device identification information, and to establish the session between the remote device and the messaging server if authentication is successful.

19. The system of claim 18 wherein:

the memory of the messaging server is configured to store a database containing remote device configuration information; and the information processing module is configured to authenticate the remote device by comparing the remote device identification information transmitted by the remote device with remote device configuration information stored in the database.

20. The system of claim 16 wherein:

the first set of information includes command requests; and the information processing module is further configured to generate command responses to the command requests, and to include the command responses as part of the second set of information.

21. The system of claim 16 wherein:

the first set of information includes remote device preference information;

the memory of the messaging server is configured to store preference information for the remote device; and the information processing module is configured to update the preference information for the remote device based on the remote device preference information contained in the first set of information.

22. The system of claim 16 further wherein the information processing module is further configured to determine a first electronic message to be transmitted to the remote device, and to include the first electronic message as part of the second set of information.

23. The system of claim 22 wherein, in order to determine the first electronic message to be transmitted to the remote device, the information processing module is further configured to use the remote device identification information to identify one or more electronic messages addressed to the remote device and which have not been transmitted to the remote device, and to select one of the identified electronic messages as the first electronic message.

24. The system of claim 22 wherein:

the network interface module is further configured to terminate the session between the remote server and the messaging server, and to determine if the first electronic message was successfully transmitted to the remote device; and the information processing module is further configured to update status of the first electronic message in the memory.

25. The system of claim 16 wherein the first set of information includes at least one message to be delivered to an addressee, and the messaging server further includes:

a message dispatcher module configured to determine if the message to be delivered is a facsimile message, and to make the message accessible to a facsimile processing module if the message is a facsimile message; and the facsimile processing module configured to format the message into a format compatible for faxing, and to make the formatted facsimile message accessible to a facsimile module, the facsimile module being configured to fax the formatted message to the addressee.

26. The system of claim 16 wherein the first set of information includes at least one message to be delivered to an addressee, and the messaging server further includes:

a message dispatcher module configured to determine if the message to be delivered is an electronic mail message, and to forward the message to a mail processing module if the message is an electronic mail message; and the mail processing module configured to route the electronic mail message to the addressee.

27. A messaging system for communicating messaging information comprising:

a messaging server coupled to a telephone network;

at least one portable hand held remote device acoustically coupled to the telephone network without requiring a wired connection between the remote device and the telephone network, the remote device configured to initiate a communication session with the messaging server over the telephone network and via the acoustical coupling, and to receive messages from the messaging server; and wherein the messaging server comprises:

a processor;

a memory coupled with the processor;

a mail processing module configured to receive a message addressed to a user of the remote device, the mail processing module further configured to determine the remote device to which the message is to be transmitted, the mail processing module further configured to process the message; and a network interface module configured to generate acoustical tones corresponding to the message to be sent to the remote device, and to communicate the acoustical tones to the remote device over the telephone network via the acoustical coupling during the communication session between the remote device and the messaging server.

28. The system of claim 27 wherein in order to determine the remote device to which the message is to be transmitted:

the memory of the messaging server is configured to maintain a list of remote devices and their corresponding users; and the mail processing is configured to determine a user to whom the message is address, and to determine from the list the remote device corresponding to the user.

29. The system of claim 27 wherein:

the memory of the messaging server is configured to store a preference database storing a set of preferences for the remote device; and the mail processing module is configured to accept the message only if the message satisfies the set of preferences.

30. The system of claim 29 wherein the set of preferences comprises filter rules selected from a group of filter rules consisting of rules based on the addressee field of the message, rules based on the sender field of the message, rules based on the title field of the message, rules based on the subject contents of the message, and rules based on the size of the message.

31. A computer program product for communicating electronic messages between a messaging server and a portable hand held remote device coupled with a telephone network, the product comprising:

code for providing a message database accessible to the messaging server for storing electronic messages;

code for establishing an acoustical coupling between the remote device and the telephone network without requiring a wired connection between the remote device and the telephone network;

code for generating an initial set of acoustical tones at the remote device corresponding to setup information to be transmitted to the messaging server;

code for transmitting the initial set of acoustical tones to the messaging server via the acoustical coupling and over the telephone network;

code for receiving the initial set of acoustical tones and converting them to setup information at the messaging server;

code for establishing a session between the remote device and the messaging server based on the setup information;

code for generating a first set of acoustical tones at the remote device remote corresponding to a first set of information to be communicated from the remote device to the messaging server;

code for transmitting the first set of acoustical tones from the remote device to the messaging server via the acoustic coupling and over the telephone network;

code for converting the first set of acoustical tones to the first set of information at the messaging server;

code for performing processing at the messaging server based on the first set of information, the processing including performing forward error correction on the first set of information;

code for assembling, at the messaging server, a second set of information to be communicated to the remote device based on the first set of information and the setup information;

code for generating a second set of acoustical tones at the messaging server corresponding to the second set of information;

code for transmitting the second set of acoustical tones from the messaging server to the remote device over the telephone network;

code for receiving at the remote device the second set of acoustical tones via the acoustical coupling and converting the second set of acoustical tones to the second set of information; and a computer-readable storage medium that stored the codes.

32. A computer program product for communicating electronic messaging information between a messaging server and a portable hand held remote device coupled with a telephone network, the product comprising:

code for receiving at the messaging server a message addressed to a user of the remote device;

code for determining the remote device to which the message is to be transmitted;

code for processing the message at the messaging server;

code for storing the message in a message database;

code for establishing a communication session between the remote device and the messaging server over the telephone network, wherein the remote device is acoustically coupled to the telephone network without requiring a wired connection between the remote device and the telephone network;

code for generating acoustical tones at the messaging server corresponding to the message to be sent to the remote device;

code for communicating the acoustical tones from the messaging server to the remote device over the telephone network via the acoustical coupling;

code for retrieving the message from the acoustical tones at the remote device; and a computer-readable storage medium that stores the codes.

* * * * *